(12) United States Patent
Nervegna

(10) Patent No.: US 8,054,125 B2
(45) Date of Patent: Nov. 8, 2011

(54) CHARGE PUMP WITH LOW POWER, HIGH VOLTAGE PROTECTION CIRCUITRY

(75) Inventor: Louis Nervegna, Andover, MA (US)

(73) Assignee: Silicon Laboratories Inc., Austin, TX (US)

( * ) Notice: Subject to any disclaimer, the term of this patent is extended or adjusted under 35 U.S.C. 154(b) by 58 days.

(21) Appl. No.: 12/650,756

(22) Filed: Dec. 31, 2009

(65) Prior Publication Data

US 2011/0156802 A1   Jun. 30, 2011

(51) Int. Cl.
*G05F 1/10* (2006.01)
(52) U.S. Cl. .......................... 327/536; 363/60
(58) Field of Classification Search ................... 327/536; 363/59–60
See application file for complete search history.

(56) References Cited

U.S. PATENT DOCUMENTS

| | | | | |
|---|---|---|---|---|
| 5,640,118 | A * | 6/1997 | Drouot | 327/306 |
| 6,147,906 | A * | 11/2000 | Bill et al. | 365/185.14 |
| 6,373,328 | B2 * | 4/2002 | Rapp | 327/536 |
| 6,441,678 | B1 * | 8/2002 | Zeng et al. | 327/536 |
| 6,552,933 | B2 * | 4/2003 | Roohparvar | 365/185.18 |
| 7,119,604 | B2 * | 10/2006 | Chih | 327/534 |
| 7,269,081 | B2 * | 9/2007 | Ito | 365/189.09 |
| 7,382,177 | B2 * | 6/2008 | Cordoba et al. | 327/536 |
| 7,382,661 | B1 * | 6/2008 | Lin | 365/185.28 |
| 7,420,497 | B2 * | 9/2008 | Chiu | 341/155 |
| 7,538,600 | B2 * | 5/2009 | Lee | 327/536 |
| 2010/0188880 | A1 * | 7/2010 | Stakely | 365/94 |
| 2011/0002164 | A1 * | 1/2011 | Soma | 365/185.2 |

* cited by examiner

*Primary Examiner* — Thomas J Hiltunen
(74) *Attorney, Agent, or Firm* — Polanski & Associates, P.L.L.C.; Ronald Michael Reed

(57) ABSTRACT

A charge pump circuitry for generating a charging voltage for programming a one time programmable (OTP) memory includes a charge pump sub-circuit for generating the charging voltage in a second voltage range when the charging voltage exceeds a threshold level. A precharge circuit generates the charging voltage in a first voltage range when the charging voltage is below the threshold level. A voltage measurement circuit determines the charging voltage. A first control circuit enables the precharge circuit and disables the charge pump sub-circuit in a first mode of operation responsive to the charging voltage being determined to be below the threshold level and disables the precharge circuit and enables the charge pump sub-circuit in a second mode of operation responsive to the charging voltage being determined to exceed the threshold level. A second control circuit provides an indication that the charging voltage has reached a charging level for programming the OTP memory responsive to the determined charging voltage.

20 Claims, 7 Drawing Sheets

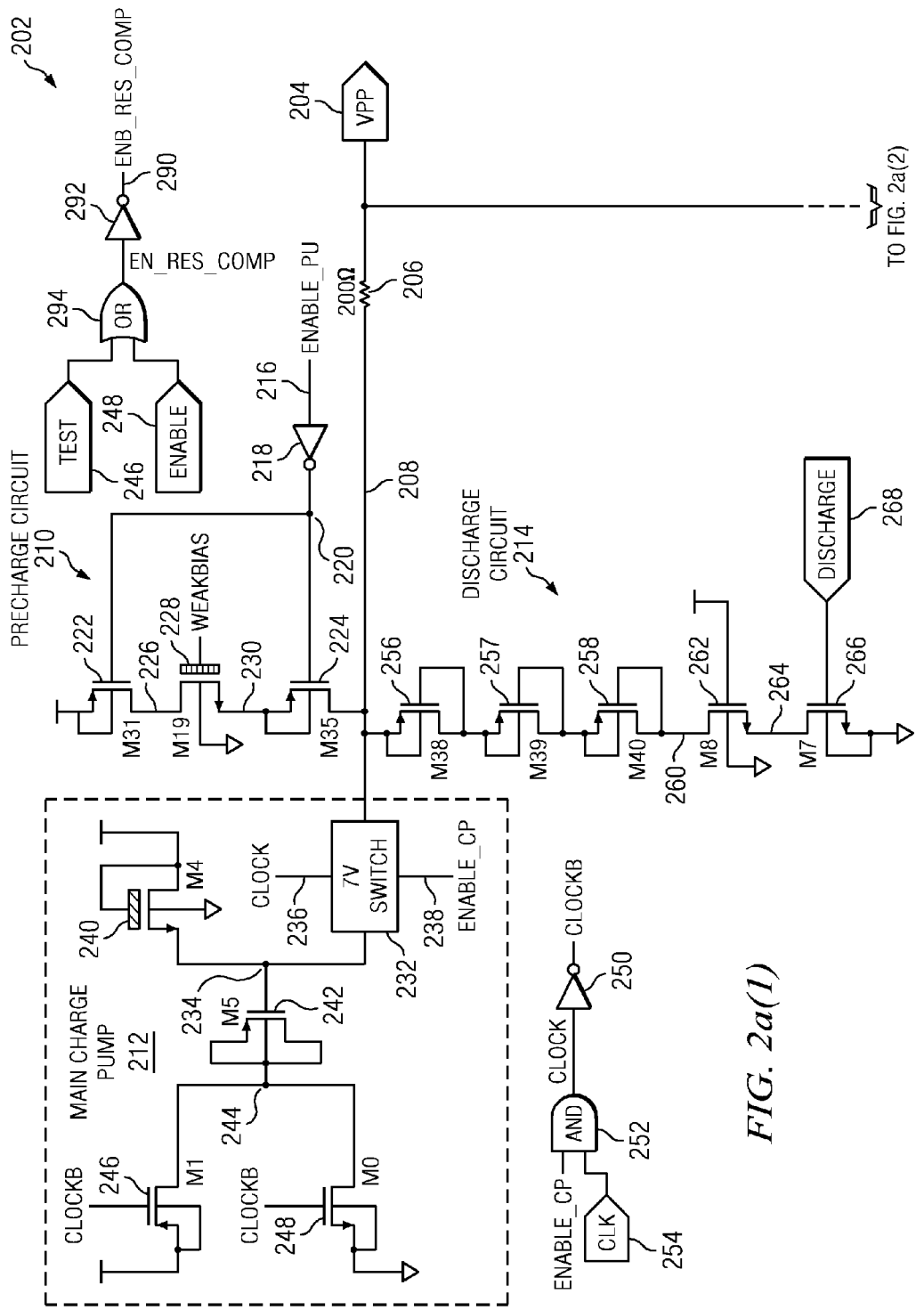
FIG. 2a(1)

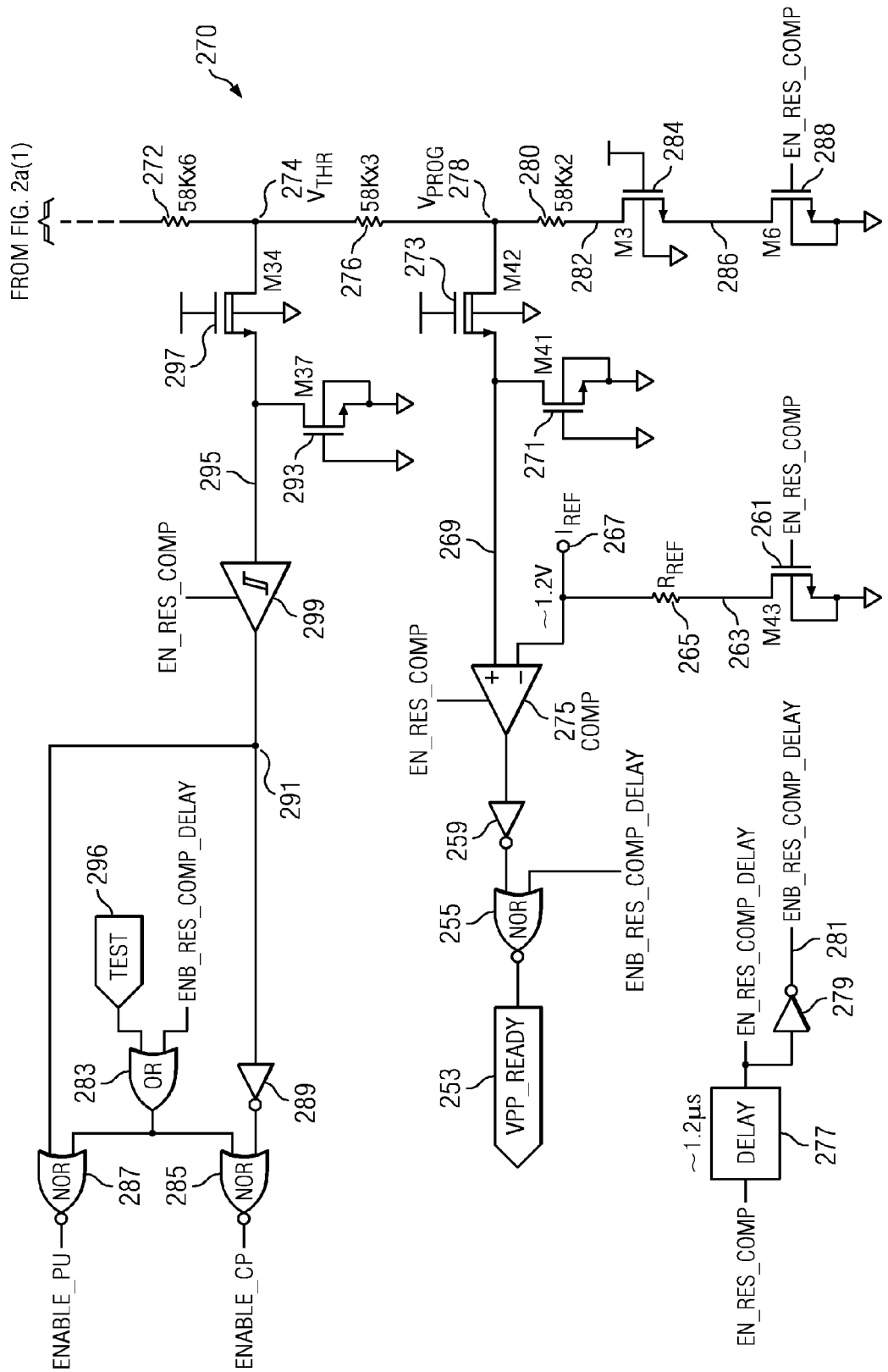
FIG. 2a(2)

CHARGE PUMP WITH LOW POWER, HIGH VOLTAGE PROTECTION CIRCUITRY

CROSS-REFERENCE TO RELATED APPLICATIONS

N/A

TECHNICAL FIELD

The present invention relates to charge pumps, and more particularly, to charge pumps including low power, high voltage protection circuitry to protect the charge pump components from high voltages that may be applied to the internal components and output of the charge pump by the charge pump circuitry itself, or that may be applied to the output of the charge pump by any circuitry attached external to the charge pump.

BACKGROUND

One time programmable (OTP) memories are a cost effective alternative to flash memory technologies and may be used in applications where the memory does not need to be erased or overwritten. OTP memories are fabricated using standard CMOS processes which do not require additional masking steps. Similar to flash memories, OTP memories require high programming voltages in order to program information into the memory. Such high programming voltages are normally generated off chip in the case of an OTP memory since these voltages far exceed the highest voltage rating of available devices in standard fine line width CMOS processes that are used to manufacture microchips containing an OTP memory.

Within flash memory technologies, charge pumps are often integrated with the memory to enable the on chip generation of required high programming voltages necessary to program the flash memory. Building high voltage charge pumps within a flash memory process is fairly straightforward. Unlike standard CMOS processes used for OTP memories, flash memory manufacturing processes include special very high voltage transistors and diodes for use in the memory design. These devices allow the flash memories to tolerate the high programming voltages required to program the memory without incurring damage. These special high voltage flash devices can thus likewise be used in the design of the charge pump itself in a straight forward way, so that the charge pump can also tolerate the high programming voltage it generates for programming without incurring damage.

OTP memories are significantly less expensive than flash memories and OTP memories may be easily substituted for flash memories in many different types of applications. In these applications where an OTP memory has been substituted for a flash memory, it would be desirable to have the ability to program the OTP memory using an on chip charge pump without running the risk of damaging the circuitry of the charge pump with the necessary high programming voltages that the charge pump must itself generate for programming. It would also be desirable to allow the alternative option of programming the OTP memory using a high voltage applied external to the charge pump via an alternative source, e.g. via a programming pin on the chip package, while concurrently protecting the charge pump from the external high voltage source and consuming very low power within the charge pump. Solutions to these problems would be of great benefit to circuit designers.

SUMMARY

The present invention, as disclosed and described herein, in one aspect there of, comprises a charge pump circuitry for generating a charging voltage for programming a one time programmable (OTP) memory and includes a charge pump sub-circuit for generating the charging voltage in a second voltage range when the charging voltage exceeds a threshold level. A precharge circuit generates the charging voltage in a first voltage range when the charging voltage is below the threshold level. A voltage measurement circuit determines the charging voltage. A first control circuit enables the precharge circuit and disables the charge pump sub-circuit in a first mode of operation responsive to the charging voltage being determined to be below the threshold level and disables the precharge circuit and enables the charge pump sub-circuit in a second mode of operation responsive to the charging voltage being determined to exceed the threshold level. A second control circuit provides an indication that the charging voltage has reached a charging level for programming the OTP memory responsive to the determined charging voltage.

BRIEF DESCRIPTION OF THE DRAWINGS

For a more complete understanding, reference is now made to the following description taken in conjunction with the accompanying Drawings in which:

FIGS. 2a(1) and 2a(2) are a schematic diagram of a charge pump for use with the OTP memory;

DETAILED DESCRIPTION

Figure 1:
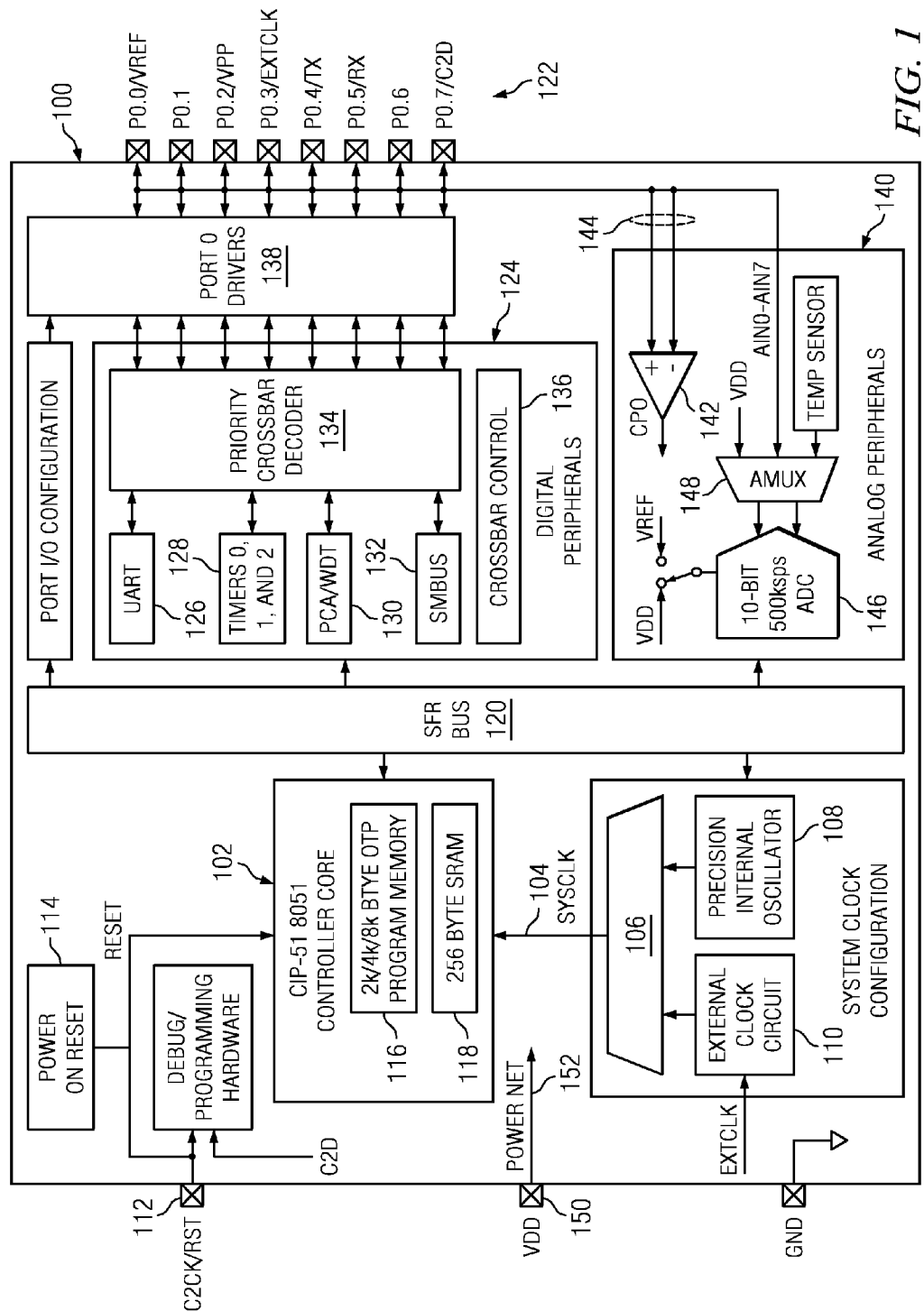
FIG. 1 is a top level diagram of an MCU including one time programmable (OTP) memory.

Referring now to the drawings, wherein like reference numbers are used herein to designate like elements throughout, the various views and embodiments of a charge pump with low power, high voltage protection circuitry are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to the drawings, and more particularly to FIG. 1, there is illustrated a block diagram of a microcontroller unit (MCU) 100. The MCU 100 is generally of the type similar to the family of part Nos. C8051F300 or C8051T600 manufactured by Silicon Laboratories, which are generally referred to as "8051 Mixed-Signal Controllers." The MCU 100 includes a processing core 102 which is typically comprised of a conventional 8-bit microprocessor of the type "8051." The processing core 102 receives a clock signal on line 104 from a multiplexer 106. The multiplexer 106 is operable to select among multiple clocks. There is provided a 24.5 MHz trimmable internal precision oscillator 108 or an external crystal control oscillator 110. The precision internal oscillator 108 is described in U.S. Patent Application Publication No. 2004/0054835, entitled "PRECISION OSCILLATOR FOR AN ASYNCHRONOUS TRANSMISSION SYSTEM," filed Sep. 16, 2002, which is incorporated herein by reference in its entirety. The processing core 102 is also operable to receive an external reset on test terminal 112 or is operable to receive the reset signal from a power on reset block 114, all of which provide a reset to processing core 102. The power or reset block 114 may also be used to bring the MCU 100 out of an ultra low power (comatose) mode. The processing core 102 has associated therewith a plurality of memory resources, those being either a 2K/4K/8K byte One Time Programmable (OTP) program memory 116 and a 256K byte SRAM memory 118. The OTP memory 116 is functionally very similar to a flash memory device, but cannot be electrically erased or overwritten once programmed. The processing core 102 interfaces with various digital and analog peripherals via an SFR bus 120. The SFR bus 120 is a special function register bus that allows the processing core 102 to interface with various operating pins 122 that can interface external to the chip to receive digital values, output digital values, receive analog values or output analog values. Various digital I/O peripherals 124 are provided, these being a UART 126, timers 128, PCA/WDT 130 and SMbus interface circuit 132. All of this circuitry 126-132 is interfaceable to the output pins 122 through a crossbar decoder 134 which is operable to configurably interface these devices with select ones of the outputs responsive to control signals from the crossbar control 136. Port drivers 138 are used for driving the signals received from the priority crossbar decoder 134 to the output pins 122. The crossbar decoder is described in U.S. Pat. No. 6,839,795, which is incorporated herein by reference.

The digital inputs/outputs to/from the digital peripherals 124 are also interfaced to analog peripherals 140. The analog peripherals 140 include an analog comparator 142 for comparing two signals received on input lines 144. The analog-to-digital converter 146 receives analog input signals from an analog multiplexer 148 interfaced to a plurality of the input pins on the MCU 100. The analog multiplexer 148 allows the multiple outputs to be sensed through the pins 122 such that the ADC 146 can be interfaced to various sensors. System power VDD is applied through pad 150. Power may be applied to the pad 150 via, for example, a battery. The power net 152 applies power to both the analog peripherals 140 and the digital peripherals 124 to power the device, as will be more fully described below.

The OTP memory 116 is used in association with the controller core 102. The inclusion of a charge pump associated with the OTP memory 116 enables the use of software that can write to the OTP memory 116 at any time during normal operation of the MCU in a customer application. This feature is referred to as In-Application Programming (IAP). The ability to provide IAP associated with a lower cost OTP memory provides a number of benefits to circuit designers. The previously programmed memory spaces within the OTP memory 116 may not be overwritten; however the memory 116 allows repeated incremental writes to the available space within the memory that has not yet been programmed. This enables the In-Application Programming within an OTP memory to function in much the same way as in a flash memory but with significantly lower costs.

Conventional wisdom with respect to charge pump design for memory applications assumes that very high voltage memory devices like those found in a flash memory are used. The lack of such devices in standard CMOS processes makes the design of high voltage charge pumps for use with OTP memories especially challenging. The devices used to build a charge pump for use with an OTP memory must protect the charge pump from the high pumping voltages necessary in order to program the associated OTP memory. Additionally, the charge pump must maintain full high voltage protection even during times when the charge pump is not pumping. This is required since the charge pump must shield itself from an approximately 6.5 volt programming voltage generated by the charge pump itself, or applied externally at the programming pin, or from 5 volt logic signals applied at the pin when the pin is instead used in general purpose 5 V tolerant digital I/O mode.

Figure 2B:
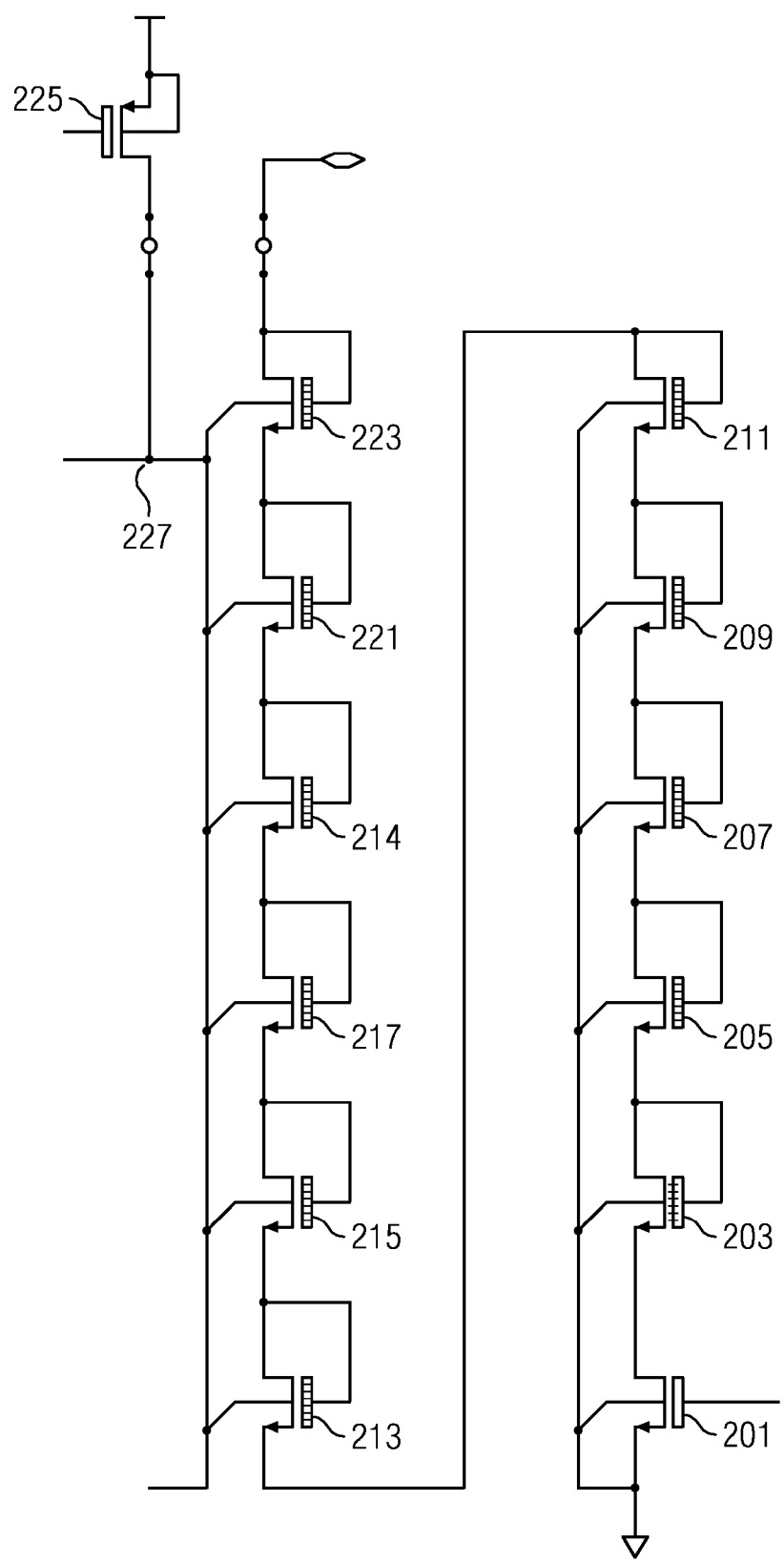
FIG. 2b is a schematic diagram of a weak bias generator circuit.

Referring now to FIG. 2a FIGS. 2a(1) and 2a(2), there is illustrated a schematic block diagram of the charge pump circuitry for use with the OTP memory 112 of the MCU described with respect to FIG. 1. The circuitry is capable of generating programming voltages as high as approximately twice the supply voltage in a standard CMOS process, using only standard devices available in the process, and without the availability of special very high voltage tolerant memory devices as found in a flash memory process. The circuitry is composed of transistors that can each individually tolerate only one single maximum rated gate oxide stress voltage drop, but that are collectively capable of generating a programming voltage as high as 2 maximum rated gate oxide stress voltage drops without incurring damage to any single individual transistor. Additionally, the circuitry can tolerate 2 maximum rated gate oxide stress voltage drops applied externally at its programming output (e.g. by another circuit) even when disabled in an ultra low power state.

Transistor devices in integrated circuits are typically rated by the fabrication provider for "maximum gate oxide stress voltages", which are maximum voltages that can be applied in the design between the gate terminal and the other transistor terminals. If the maximum rated gate oxide voltage is exceeded, it will either decrease the expected functional lifetime of the device or cause immediate functional damage to the device—the severity depending on 'by how much' and 'for how long' the maximum rated gate oxide stress voltage was exceeded. For example, the logic devices in a typical 0.18 um CMOS process are rated to a maximum gate oxide stress voltage of 1.8V+10%=>~2V and the IO devices in the same process are rated to 3.3V+10%=>~3.6V.

The design provides a charge pump with low power, high voltage protection circuitry manufactured using a standard CMOS process without the use of special high voltage memory devices, e.g. a standard 0.18 um mixed-signal process with the availability of standard IO devices that tolerate twice the maximum rated gate oxide stress voltage of logic devices (3.6 V IO vs 1.8 V logic). The preference in this design is to use IO devices whenever possible, as these tolerate the highest possible voltage in a standard CMOS process. However, logic devices may be substituted if IO devices are not available. The charge pump circuit 202 provides the ability to generate a programming voltage that is provided at a programming pin VPP 204. An ESD protection resistor 206 is connected between pin 204 and node 208. Connected to node 208 are a pre-charge circuit 210 (also referred to as the pull-up circuit, abbreviated PU), the main charge pump (also referred to as the charge pump sub-circuit) 212 and a discharge circuit 214. The pre-charge circuit 210 provides the programming voltage VPP to pin 204 while the programming voltage at pin 204 is between ground and approximately Vdd−2Vdd/9, e.g. 0 V and 3.6V−0.8 V=2.8 V. The pre-charge circuit 214 is enabled via the ENABLE_PU signal provided at node 216. The ENABLE_PU signal is provided from the output of control circuitry which will be more fully discussed herein below. The ENABLE_PU signal at node 216 is provided to the input of an inverter 218. The output of inverter 218 is connected to node 220 which is connected to the gates of P-channel transistors 222 and 224, respectively. Transistor 222 has its source/drain path connected between the supply voltage and node 226, with the bulk connected to supply. N-channel transistor 228 has its drain/source path connected between node 226 and node 230. The gate of transistor 228 is connected to receive a control signal WEAKBIAS. The bulk of transistor 228 is connected to ground. It is superior to choose a native N-channel device for 228 with a threshold voltage close to zero, although a regular N-channel device may be substituted if native devices are not available in the fabrication process. The previously discussed transistor 224 has its source/drain path connected between node 230 and node 208, with the bulk connected to the source. As mentioned previously, the pre-charge circuit 210 provides the programming voltage VPP from a level of 0 volts to a level of approximately Vdd−2Vdd/9.

Pre-charging the programming voltage VPP to approximately Vdd−2Vdd/9, e.g. 3.6 V−0.8 V=2.8 V, using the pre-charge circuit 210 assists a 7 V switch 232 within the main charge pump 212 with the task of remaining 7 V tolerant during operation of the main charge pump 212. In this context, the terminology "7 V tolerant" means that the switch is able to tolerate 7 V without incurring damage to any of its internal devices. The charge pump 212 pumps the VPP voltage at pin 204 from approximately 2.8 volts to approximately 7 volts responsive to a 3.6 volt supply voltage or from approximately 2.6 volts to approximately 6.4 volts responsive to a 3.3 volt supply voltage. The main charge pump 212 includes the 7 V switch 232 which is connected between node 208 and node 234. The 7 V switch 232 receives the pumping voltage from node 234 and also receives a clock signal CLOCK via a clock input 236. The main charge pump 212 is enabled and disabled via an ENABLE_CP signal provided at enable input 238. N-channel transistor 240 has its drain/source path connected between the supply voltage and node 234, with its bulk connected to ground. The gate of transistor 240 is also connected to its drain, so that the device functions as a diode. It is superior to choose a native N-channel device for transistor 240 with a threshold voltage close to zero, although a regular N-channel device may be substituted if native devices are not available in the fabrication process. P-channel transistor 242 is configured between node 234 and node 244 as a capacitor. The drain, source and bulk of transistor 242 are interconnected with each other and to node 244 and form the bottom plate of the capacitor. The gate of transistor 242 is connected to node 234 and forms the top plate of the capacitor. Transistor 246 comprises a P-channel transistor having its drain/source path connected between the system power node and node 244, with its bulk connected to the supply voltage. The gate of transistor 246 is connected to receive the inverted version of the clock signal CLOCKB. Transistor 248 comprises an N-channel transistor having its drain/source path connected between node 244 and ground, with its bulk connected to ground. The gate of transistor 248 is also connected to receive the inverted clock signal CLOCKB.

In a first phase of operation, the main charge pump charges the capacitor represented by transistor 242 up to the supply voltage, e.g. 3.6 volts, by turning off transistor 246 and turning on transistor 248. This configuration connects the bottom plate of capacitor 242 to ground through transistor 248. It also connects the top plate of capacitor 242 to the supply voltage through the diode represented by transistor 240 which automatically turns on as its source voltage at node 234 falls below the supply rail. The use of a native N-channel device for diode 240 instead a regular N-channel device allows the turn-on voltage of the diode to be near zero, and thus allows the capacitor to charge almost fully to the supply voltage, e.g. 3.6 V, before the diode 240 turns off. In the second phase, transistor 248 is turned off and transistor 246 is turned on. This configuration connects the bottom plate of the capacitor 242 to the supply rail, e.g. 3.6 V, through transistor 246, so that the previously stored supply voltage on the capacitor from the first phase, e.g. 3.6 V, now appears in series with the supply rail. In this series configuration, the total voltage appearing at the top plate of capacitor 242 with reference to ground now becomes equal to twice the supply voltage, e.g. 3.6 V+3.6 V=7.2 V. The top plate voltage at node 234, which is now equal to twice the supply, e.g. 7.2 V, is then used to pump the programming pin Vpp 204 through the 7 V switch by sharing its charge with any capacitance connected to pin Vpp 204 either internal or external to the chip. The CLOCKB signal at the gates of transistors 246 and 248 is provided from the output of an inverter 250. The gate of inverter 250 receives the clock signal CLOCK from the output of AND gate 252. The inputs of AND gate 252 are connected to receive the ENABLE_CP signal from control circuitry as will be discussed more fully herein below and the clock input pin 254 that receives the clock signal CLK from the rest of the chip.

The discharge circuit 214 is connected between node 208 and ground. Given a 3.6 V supply, the discharge circuit 214 discharges the programming voltage VPP at pin 204 to approximately 3 volts after programming of an associated OTP memory is completed. This discharge event is undertaken to remove any residual programming voltage (e.g. approximately 6.5 V) from the chip programming pin Vpp 204, so that this programming pin can then instead be reused as a general purpose IO to the chip where only pin voltages below the supply rail, e.g. <3.6 V, can be tolerated without incurring damage in sensitive analog IO modes. The discharge circuit 214 includes a series connection of diode connected transistors 256, 257 and 258 between nodes 208 and node 260. The gates of each of the transistors 256, 257 and 258 are connected to their drains and the bulk of each of the transistors 256, 257 and 258 are connected to their source. An N-channel transistor 262 has its drain/source path connected between node 260 and node 264. The gate of transistor 262 is connected to the supply voltage and the bulk of transistor 262 is connected to ground. A second N-channel transistor 266 has its drain/source path connected between nodes 264 and ground. The gate of transistor 266 is connected to receive a control signal DISCHARGE at pin 268. The DISCHARGE signal is provided and controlled via a special function register and turns on and off the discharge circuit 214. The discharge circuit 214 is turned "on" when the discharge signal is at a logical "high" level and turns "off" when the discharge signal is at a logical "low" level.

Also connected to the programming voltage pin 204 is a resistor divider 270. A first resistor 272, which in one embodiment may consist of 6 segments, is connected between pin 204 and node 274. A second resistor 276, which in one embodiment may consist of 3 segments, is connected between node 274 and node 278. A third resistor 280, which in one embodiment may consist of 2 segments, is connected between node 278 and node 282. An N-channel transistor 284 has its drain/source path connected between node 282 and node 286, its gate connected to the supply voltage and its bulk connected to ground. An N-channel transistor 288 is connected between node 286 and ground, with its bulk connected to ground. The gate of transistor 288 is connected to receive the enable signal EN_RES_COMP which enables the resistor and comparator circuits independent of the remaining charge pump circuitry. The inverse of this control signal is generated at node 290 from the output of inverter 292. The input of inverter 292 receives the EN_RES_COMP control signal from the output of OR gate 294. The inputs of OR gate 294 are connected to receive a TEST signal at test pin 296 which enables the charge pump test mode used for characterization and production trimming, and an ENABLE signal at enable pin 298 which enables all of the charge pump circuitry at once, including the resistor and comparator circuits. The resistor divider 270 monitors the voltage at the VPP pin 204 and enables the determination of two different things. First, at node 274, a threshold voltage $V_{THR}$ is monitored to determine when to select between operation of the pre-charge circuit 210 and the main charge pump 212. Additionally, the voltage $V_{PROG}$ at node 278 is monitored to enable a determination of when the VPP voltage at pin 204 has reached the necessary level for programming an associated OTP memory.

The threshold voltage $V_{THR}$ is monitored by a Schmitt trigger 299. The Schmitt trigger 299 enables a selection between operation of the pre-charge circuit 210 and the main charge pump circuit 212 based upon the threshold voltage $V_{THR}$ at node 274. An N-channel transistor 297 has its drain/source path connected between node 274 and node 295, connected to the input of the Schmitt trigger 299, with its bulk connected to ground. The gate of transistor 297 is connected to the supply voltage $V_{DD}$. It is superior to choose a low or medium threshold N-channel device for 297, although a regular N-channel device may be substituted if low or medium threshold devices are not available in the fabrication process. A transistor 293 has its drain/source path connected between node 295 and ground, with its bulk connected to ground. The gate of transistor 293 is also connected to ground such that the device operates in the weak inversion region and provides an intentional leakage current. The output of the Schmitt trigger 299 is connected at node 291 to the input of an inverter 289 and to one input of a NOR gate 287. The output of inverter 289 is connected to a second NOR gate 285. The second input of each of nor gates 287 and 285 are connected to the output of an OR gate 283. The inputs of OR gate 283 are connected to a test pin (TEST) 296 and to receive a control signal ENB_RES_COMP_DELAY. The ENB_RES_COMP_DELAY signal is generated at node 281 at the output of an inverter 279. The inverter 279 is connected to the output of a time delay circuit 277 which generates the ENB_RES_COMP_DELAY signal responsive to the input ENB_RES_COMP signal at the input of the time delay circuit 277.

The output of NOR gate 287 is used for enabling and disabling the pre-charge circuit 210. When the ENABLE_PU signal is at a logical "high" level, the pre-charge circuit 210 is enabled. When the ENABLE_PU signal is at a logical "low" level, the pre-charge circuit 210 is disabled. Similarly, the output of NOR gate 285 (ENABLE_CP) is used for enabling and disabling the main charge pump 212. When the ENABLE_CP signal is at a logical "high" level, the main charge pump 212 is enabled and when the signal is at a logical "low" level, the main charge pump is disabled.

A comparator 275 monitors the $V_{PROG}$ voltage at node 278 within the resistor divider 270 to determine when to drive the VPP_READY signal to a logical "high" level indicating that the VPP voltage at pin 204 is high enough for programming an associated OTP memory, e.g. 6.5 V. An N-channel transistor 273 has its drain/source path connected between node 278 and the node 269, connected to the non-inverting input of comparator 275, with its bulk connected to ground. The gate of transistor 273 is connected to the supply voltage. It is superior to choose a low or medium threshold N-channel device for 273, although a regular N-channel device may be substituted if low or medium threshold devices are not available in the fabrication process. The N-channel transistor 271 has its drain/source path connected between node 269 and ground. The gate of transistor 271 is also connected to ground such that the device operates in the weak inversion region and provides an intentional leakage current. The inverting input of comparator 275 is connected to receive a reference current $I_{REF}$ at node 267. A resistor 265 is connected between node 267 and node 263. The resistor 265 is selected to establish a particular reference voltage at the inverting input of the comparator 275 responsive to the reference current $I_{REF}$ at node 267. In one embodiment, the current $I_{REF}$ comprises a trimmed bandgap current which is dropped across the resistor 265 to generate a reference voltage of approximately 1.2 volts. The programming voltage VPP will thus be indicated at VPP_READY as logic "high", i.e. ready to program the OTP memory, when it reaches 6.5 volts as established by the trimmed bandgap current. The programming voltage Vpp can be adjusted to other voltages besides 6.5 V by trimming Iref, and thus Vref=Iref*Rref, to different values.

The comparator 275 is enabled and disabled responsive to a control signal EN_RES_COMP which is applied to the gate of a transistor 261 and the comparator 275. The drain/source path of the N-channel transistor 261 is connected between node 263 and ground, with its bulk connected to ground. The EN_RES_COMP signal is provided from the output of OR gate 294 as discussed previously. The output of the comparator 275 is provided to the input of an inverter 259. The output of the inverter 259 is provided to a first input of a NOR gate 255. The other input of NOR gate 255 is connected to receive the ENB_RES_COMP_DELAY control signal from node 281. The output of the NOR gate 255 provides the VPP_READY signal to pin 253. The VPP_READY signal indicates whether or not the VPP voltage at pin 204 has risen to a sufficient level to program an OTP memory, as compared to the reference voltage Vref=$I_{REF}$*Rref applied at node 267.

The charge pump circuitry of FIGS. 2a(1) and 2a(2) have several different modes of operation depending upon how the circuit is presently being used in association with its OTP memory. Each of these various modes of operation are described herein below with respect to FIGS. 2a(1) and 2a(2) and the operation of the circuitry in each mode is further illustrated.

Disable Mode

In the "disable mode" of operation, the charge pump circuit 202 is disabled and is not being used to provide a programming voltage at the VPP pin 204 to an associated OTP memory, but is still engaging its low power, high voltage protection circuitry against any high voltage that may be applied externally to the Vpp pin, e.g. 6.5V. This may be done in a case, for example, when an external programming voltage is being utilized to program the OTP memory via the shared Vpp pin 204 rather than a voltage provided from the charge pump 202. Alternatively, this mode could be used when the associated OTP memory is not presently being programmed, and when the shared programming pin Vpp 204 on the chip is instead being reused as a general purpose IO. In the disable mode, the various input control pins to the charge pump 202 have the following values: pin 298 ENABLE=low, pin 296 TEST=low, pin 268 DISCHARGE=low, pin 254 CLK=anything. In the disable mode, the charge pump circuit 202 is sitting idle and is disabled. Pin 254 may continue to receive the clock signal CLK from the rest of the chip. The programming voltage VPP at pin 204 may be greater than the supply voltage $V_{DD}$ in the disable mode, e.g. 6.5 V Vpp>3.6 V Vdd, and therefore the charge pump must continue to protect its internal devices from a possible high voltage applied at Vpp, e.g. 6.5 V, which the internal charge pump devices could not ordinarily tolerate without the use of special high voltage protection circuitry.

The charge pump 202 is placed in disable mode when the ENABLE signal at pin 298 and the TEST signal at pin 296 are both low. This control signal configuration forces the EN_RES_COMP signal at the output of OR gate 294 low and the ENB_RES_COMP signal at the output of inverter 292 high. The EN_RES_COMP signal of value low is then applied to the time delay circuit 277 causing the EN_RES_COMP_DELAY signal to also go low after the appropriate time delay has occurred, and causing the ENB_RES_COMP_DELAY signal to then go high. The ENB_RES_COMP_DELAY signal is applied to the input of OR gate 283 along with the low TEST signal at pin 300 causing the output of the OR gate to go high which forces the outputs of NOR gates 287 and 285, the ENABLE_PU signal and the ENABLE_CP signal, to both go low. The ENABLE_PU and ENABLE_CP control signals then disable both the pre-charge circuit 210 and the main charge pump circuit 212, respectively.

The ENB_RES_COMP_DELAY signal provided at node 281 is high which forces the VPP_READY signal at pin 253 low via NOR gate 255. When the ENABLE_CP signal from NOR gate 285 is low, this forces the CLOCK signal at the output of AND gate 252 low and the CLOCKB signal at the output of inverter 250 high, which prevents the internal version of the clock signal CLOCK and inverted clock signal CLOCKB from oscillating, irregardless of the presence of any clock signal applied at the CLK pin 254. Gating the clock pin CLK 254 in this manner reduces the power of the charge pump 202 as much as possible in disable mode. The CLOCKB signal of value high turns off transistor 246 within the main charge pump 212 and turns on transistor 248 within the main charge pump 212. This pulls the bottom plate of the capacitor formed by transistor 242 to ground. Additionally, the diode represented by native transistor 240 turns on in this configuration, as its source is pulled below the supply, and as a result, charges the top plate of the capacitor represented by transistor 242 up to the supply rail voltage, e.g. 3.6 volts.

When the clock signal CLOCK at the output of AND gate 252 goes low, this turns off the 7 V switch 232 and disconnects the main charge pump 212 from the VPP pin 204. Turning off the 7 V switch 232 protects the main charge pump 212 from any high voltage applied externally to the VPP pin 204, e.g. 6.5 V, as a result of the unique internal design of the 7V switch which will be described herein below. When the DISCHARGE pin 268 is configured low, this turns off transistor 266 causing its drain at node 264 to float to approximately Vdd−$V_{TH}$, where Vth is the threshold voltage of transistor 262. The small weak inversion leakage current provided by transistor 266 with Vgs=0 V causes node 264 to float to Vdd−Vth instead of above Vdd; if the leakage were instead zero, then node 264 would float above Vdd which is undesirable because the oxide of 266 would be overstressed. The diode connected PMOS 256 sees a voltage of Vpp on its source and Vpp−Vth on its drain, as a result of the leakage current from transistor 266. The diode connected PMOS 257 sees a voltage of Vpp−Vth on its source and Vpp−2Vth on its drain, again as a result of the leakage from transistor 266. And the diode 258 sees a voltage of Vpp−2Vth on its source and Vpp−3Vth on its drain, again as a result of the leakage from 266.

As a result of their unique configuration, transistors 262, 266, 256, 257, 258 within the discharge circuit 214 are protected when the programming voltage VPP equals as high as twice the supply voltage, e.g. 2×3.6V=7.2V, assuming the supply voltage does not exceed the maximum rated gate oxide stress voltage, e.g. 3.6 V. With Vpp equal to twice the supply, no path across the transistor oxides of 262, 266, 256, 257, 258 (gate-to-source, gate-to-drain, gate-to-bulk) or across their channels (drain-to-source) sees more than a single supply voltage drop, e.g. 3.6 V, in this configuration. The bulk of transistors 256, 257 and 258 are tied to their source so their junction diodes may not become forward biased when the programming voltage VPP goes higher than the supply rail.

With the EN_RES_COMP signal at value low, this turns off transistor 288 at the bottom of the resistor divider network 270. This causes the drain of transistor 288 to float to approximately Vdd−$V_{TH}$, as a result of the leakage current from transistor 288; if the leakage were instead zero, then node 284 would float above Vdd which is undesirable because the oxide of 288 would be overstressed. All resistor nodes within the divider 270 are at the programming voltage VPP since only a tiny leakage current is flowing through them when transistor 288 is turned off. As a result of their unique configuration, transistors 288 and 284 within the resistor divider 270 are protected when the programming voltage VPP equals as high as twice the supply voltage, e.g. 2×3.6V=7.2V, assuming the supply voltage does not exceed the maximum rated gate oxide stress voltage, e.g. 3.6 V. With Vpp equal to twice the supply voltage, no path across the transistor oxides of 288 or 284 (gate-to-source, gate-to-drain, gate-to-bulk) sees more than a single supply voltage drop, e.g. 3.6 V, in this configuration. Also, the drain-to-source path across these devices sees no more than a single supply voltage drop plus a threshold, e.g. 3.6 V+Vth.

Transistor 297 associated with node 274 and transistor 273 associated with node 278 have only a tiny leakage current through them to ground, intentionally introduced by transistors 293 and 271, respectively, which operate in the weak inversion region with Vgs=0V. Thus, the sources of each of transistors 297 and 273 float to approximately Vdd−$V_{TH}$ when Vpp>Vdd, which protects both the input to the Schmitt trigger 299 and the input to the comparator 275 from VPP voltages at pin 204 as high as twice the supply voltage, e.g. 2×3.6V=7.2 V, assuming the supply voltage does not exceed the maximum rated gate oxide stress voltage, e.g. 3.6 V. If transistors 293 and 271 did not exist in the design to provide a source of leakage at nodes 295 and 269, respectively, then the sources of transistors 297 and 273 will float above the supply voltage Vdd which is undesirable because this would cause stress to the oxides of the transistors inside the comparator 275 and Schmitt Trigger 299. With Vpp equal to twice the supply voltage, e.g. 7.2 V, no path across the transistor oxides of 297, 273, 293, 271 (gate-to-source, gate-to-drain, gate-to-bulk) sees more than a single supply voltage drop, e.g. 3.6 V, in this configuration. Also, the drain-to-source path across these devices sees no more than a single supply voltage drop plus a threshold, e.g. 3.6 V+Vth. Likewise, neither the input to the Schmitt trigger 299 nor the input to the comparator sees more than a single supply voltage drop, e.g. 3.6 V, with reference to ground.

When the pre-charge unit enable signal (ENABLE_PU) is low, this forces the gates of transistors 224 and 222 to the supply rail, e.g. 3.6 volts, which prevents native transistor 228 from pulling up on VPP at node 208 when VPP is less than the supply voltage. One design option is to connect the bias voltage WEAKBIAS to the supply voltage, e.g. 3.6V. With WEAKBIAS equal to the supply, native transistor 228 is turned off with Vgs=0V when the programming voltage VPP is greater than the supply voltage. With WEAKBIAS set to the supply voltage, transistors 222, 228, and 224 within the precharge circuit 210 are protected from a programming voltage VPP as high as twice the supply voltage, e.g. 2×3.6V=7.2V, assuming the supply voltage does not exceed the maximum rated gate oxide stress voltage, e.g. 3.6 V. With Vpp equal to twice the supply voltage, no path across the transistor oxides of 222, 228, or 284 (gate-to-source, gate-to-drain, gate-to-bulk) or across the channel (drain-to-source)

sees more than a single supply voltage drop, e.g. 3.6 V, in this configuration. A preferred design option is to connect WEAKBIAS to a voltage several hundred millivolts less than the supply voltage, e.g. 3.2 V. Since 228 is a native device, it draws a very high leakage current from the Vpp pin 204 when Vpp>Vdd, which is undesirable when the Vpp pin 204 is re-used as a general purpose IO. Lowering the value of WEAKBIAS (and hence the Vgs of the native device 228) lowers the value of the leakage current drawn into Vpp 204 in an exponential fashion, since the exponent is proportional to Vgs−Vth. The tradeoff to lowering WEAKBIAS below the supply is that additional voltage stress is placed on the oxide of the native device 228 when Vpp>Vdd, especially in the worst case of Vpp=2×Vdd, which is generally tolerable when WEAKBIAS is only lowered by a few hundred millivolts.

The Schmitt trigger 299 is disabled so that a voltage of Vdd−$V_{TH}$ at its input does not cause a crow bar current. Additionally, the comparator 275 is turned off to save power. Transistor 261 associated with the comparator 275 is turned off to save $I_{REF}$ power in disable mode.

Pre-Charge Mode

The "pre-charge mode" occurs when the charge pump 202 is enabled and the voltage appearing at the programming pin Vpp 204 is between ground and Vdd−2Vdd/9, e.g. 0 V and 3.6 V−0.8 V=2.8 V. In this condition, the pre-charge circuit 210 is enabled responsive to the output of the Schmitt trigger 299, and the main charge pump 212 is disabled. Note that there are no high voltage protection concerns in pre-charge mode because Vpp remains less than Vdd at all times, under the assumption that Vdd does not exceed the maximum rated gate oxide stress voltage. Assuming Vpp is less than Vdd−2Vdd/9, the pre-charge mode is initiated responsive to the ENABLE input at pin 298 going to a high level, assuming that the TEST pin 296 is low (indicating test mode is off). This forces the EN_RES_COMP signal high and the ENB_RES_COMP at the output of inverter 292 low. When the EN_RES_COMP signal goes high, this turns on the resistor divider network 270 by turning on transistor 288. The Schmitt trigger 299 and comparator 275 are additionally turned on responsive to the EN_RES_COMP signal going high.

After an appropriate time delay, e.g. approximately 1.2 microseconds, the EN_RES_COMP_DELAY signal transitions from low to high responsive to the EN_RES_COMP signal going high. Additionally, the ENB_RES_COMP_DELAY signal at the output of the inverter 279 associated with the time delay circuit 277 transitions from high to low. This delay is introduced to allow time for the resistor divider 270, the Schmitt trigger 299, and the comparator 275 to completely turn on, i.e. to allow time for all voltage transients in these circuits to settle to their steady-state values.

With the ENB_RES_COMP_DELAY and TEST signals low, the Schmitt trigger 299 is allowed to control the status of the ENABLE_PU signal and ENABLE_CP signal. This is achieved by the output of the OR gate 283 going low responsive to the ENB_RES_COMP_DELAY signal going low, and the fact that TEST is already low. The ENB_RES_COMP_DELAY signal going low also enables the output of the comparator 275 to control the status of the VPP_READY signal at pin 253 via NOR gate 255.

The gates of transistors 222 and 224 of the pre-charge circuit 210 are connected to ground during the pre-charge mode enabling the native device 228 to pull up on the Vpp voltage at node 208 when Vpp is less than the supply voltage. With the ENABLE signal high, the value of the WEAKBIAS signal is forced to the supply voltage Vdd by the weak bias generator circuit in FIG. 2b, which enables the native device 228 to have maximum drive while pulling up and to pull up all the way to the supply rail (since the device is a native with zero threshold, it can pull up all the way to its gate voltage before turning off). The pre-charge circuit 210 thus pulls node 208 up towards the supply voltage, e.g. 3.6 volts, until the Schmitt trigger 299 disables the pre-charge circuit 210 at approximately Vdd−2Vdd/9 and instead enables the main charge pump 212. Note that during the pre-charge mode, the VPP_READY signal at pin 253 remains low at all times, since the pre-charge circuit is incapable of raising VPP 204 to the level necessary to program an associated OTP memory and thus to switch the state of the comparator 275.

Pumping Mode

Once the programming voltage VPP has increased from ground to about Vdd−2Vdd/9, e.g. 3.6 V−0.8 V=2.8 V, the Schmitt trigger 299 will switch states causing the ENABLE_PU signal to go from high to low disabling the pre-charge circuit 210, and the ENABLE_CP signal will go from low to high enabling the main charge pump 212. When this occurs, the charge pump 202 enters its "pumping mode".

When the pre-charge circuit 210 is disabled, the voltage at the gates of transistors 222 and 224 goes from ground to Vdd which turns off each of transistors 222 and 224, and which prevents native device 228 from further pulling up on node 208. As Vpp is pumped above the supply voltage Vdd by the main charge pump 212, the native device 228 automatically turns off, which occurs as a result of its Vgs becoming zero. Note that WEAKBIAS is set to a value of Vdd in pumping mode by the weak bias generator circuit in FIG. 2b, as was also the case in pre-charge mode.

When the ENABLE_CP signal goes from low to high, this removes the clock gating block caused by AND gate 252, enabling the CLK signal applied at pin 254 to pass through to the main charge pump 212 and be received at the gates of transistors 246 and 248 as the signal CLOCKB and by the 7 V switch as the signal CLOCK. When the CLK signal toggles high to a voltage of Vdd, the CLOCKB signal will toggle low to ground and the CLOCK signal will toggle high to Vdd. This will turn on transistor 246 and turn off transistor 248, connecting the bottom plate of the capacitor represented by transistor 242 to the supply voltage $V_{DD}$ through transistor 246. A voltage of 2Vdd, e.g. 7.2 V, now appears on the top plate of the capacitor represented by transistor 242, since the top plate was previously charged up to Vdd, e.g. 3.6 V, during the previous phase of the clock cycle in the pumping mode or during the pre-charge or disable modes. When the voltage at node 234 (i.e., the top plate of the capacitor) transitions to 2Vdd, e.g. 7.2 volts, this automatically turns off the native diode represented by transistor 240. The 7 volt switch 232 will then turn on as a result of the signal CLOCK going high, enabling the charge at node 234 to flow to the programming voltage pin 204, and resulting in the discharge of the capacitor 242.

During the next phase of the clock when CLK goes from high to low, e.g. from 3.6 volts to 0 volts, transistor 246 is turned off and transistor 248 is turned on. This connects the bottom plate of capacitor 242 to ground through transistor 248. The top plate of the capacitor represented by transistor 242 is then recharged to Vdd, e.g. 3.6 volts, as the diode 240 automatically turns on when its source falls below the supply rail. This iterative pumping cycle repeats until the programming voltage VPP charges to the level necessary to program an associated OTP memory, e.g. 6.5 volts, at pin 204 and triggers the comparator 275 to transition the VPP_READY signal high at pin 253. The number of pumping cycles necessary to reach the desired programming voltage, e.g. 6.5 V, depends heavily on the amount of capacitance attached to the Vpp pin 204. The larger the capacitance, the more pumping cycles required.

As a result of their unique configuration, transistors 246, 248, 242, and 240 within the main charge pump 212 are protected when the pumping voltage at node 234 equals as high as twice the supply voltage, e.g. 2×3.6V=7.2V during pumping mode, assuming the supply voltage does not exceed the maximum rated gate oxide stress voltage, e.g. 3.6 V. With the pumping voltage at node 234 equal to twice the supply voltage, no path across the transistor oxides of 246, 248, 242, 240 (gate-to-source, gate-to-drain, gate-to-bulk) or across their channels (drain-to-source) sees more than a single supply voltage drop, e.g. 3.6 V, in this configuration.

Discharge Mode

Once the programming voltage VPP has been charged up to the necessary programming level, e.g. 6.5 V, and the OTP memory has been successfully programmed, the voltage at the VPP pin 204 has the option of being discharged before the charge pump circuitry is disabled. The "discharge mode" discharges the programming voltage VPP to a value below the supply voltage, e.g. <3.6 V. During the discharge mode, the voltage at the gate of transistor 266 goes high to a voltage of Vdd which creates a path between node 208 and ground, causing the voltage at pin 204 to be discharged to a voltage level of three diode drops above ground (where each diode drop is approximately equal to the respective threshold voltage Vth of each of the diode-connected transistors 256, 257, 258). The number of stacked diodes can be adjusted to change the final discharge voltage.

As a result of their unique configuration, transistors 262, 266, 256, 257, 258 within the discharge circuit 214 are protected during discharge mode when the voltage at the VPP pin 204 equals as high as twice the supply voltage, e.g. 2×3.6V=7.2V, assuming the supply voltage does not exceed the maximum rated gate oxide stress voltage, e.g. 3.6 V. With Vpp equal to twice the supply voltage, no path across the transistor oxides of 262, 266, 256, 257, 258 (gate-to-source, gate-to-drain, gate-to-bulk) or across their channels (drain-to-source) sees more than a single supply voltage drop, e.g. 3.6 V, in this configuration. The bulk of transistors 256, 257 and 258 are tied to their source so their junction diodes do not become forward biased when the programming voltage VPP is higher than the supply rail during discharge mode.

Test Mode

Figure 3:
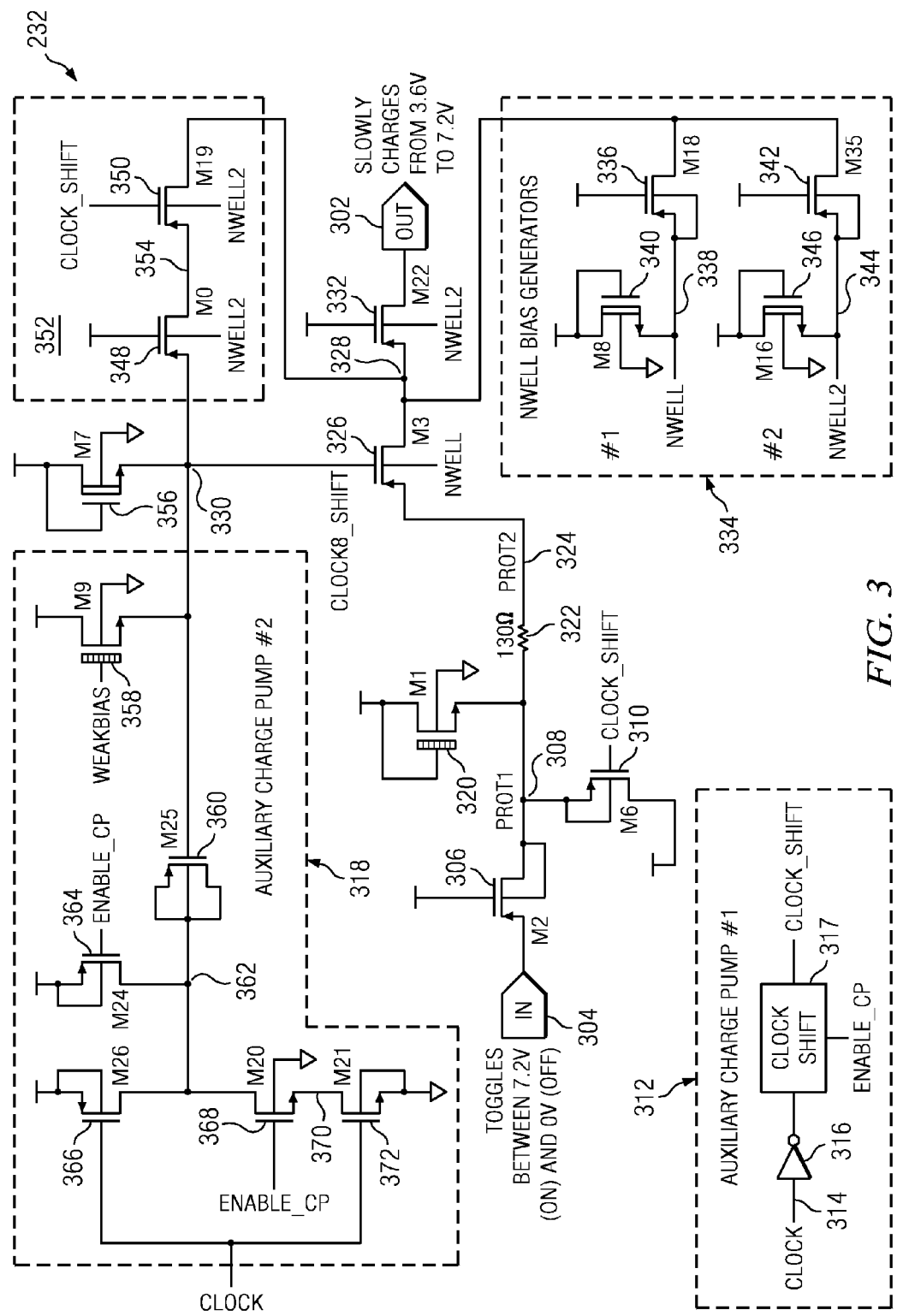
FIG. 3 is a schematic diagram of the 7 V switch within the charge pump.

The "test mode" of operation allows production trimming of the reference current $I_{REF}$ applied to the inverting input of comparator 275. Within the test mode, only the resistor divider 270, Schmitt trigger 299 and comparator 275 are turned on. This is achieved by driving the TEST signal at pin 296 high which drives the EN_RES_COMP signal high. This enables the comparator 275, the Schmitt trigger 299, and turns on transistor 288 which enables the resistor divider. Within the test mode, the known programming voltage of the OTP memory, e.g. 6.5 volts, is forced onto the VPP pin 204 by a testing machine, and the digital trim bits controlling the value of Iref are searched until the VPP_READY signal at node 253 toggles between low and high or between high and low, as a result of the testing machine toggling adjacent trim bits (i.e., trim settings that differ by only one bit). One of these adjacent trim bits is then chosen as the trim setting for establishing the optimal $I_{REF}$ current at node 267 for the particular part being tested. When the charge pump 202 is later used in pumping mode, with this now established optimal trim setting for Iref programmed in, the VPP_READY signal will toggle high at precisely the voltage that was applied to Vpp during test mode, e.g. 6.5V. During test mode, all of the transistors in the charge pump 202 remain protected against Vpp voltages as high as 2Vdd, e.g. 3.6 V+3.6 V=7.2 V, assuming the supply voltage does not exceed the maximum rated gate oxide stress voltage, e.g. 3.6 V 7 V Switch Referring now to FIG. 3, there is provided a schematic diagram of the "7 V switch" 232. As noted previously, the 7 V switch 232 allows voltages as high as 2Vdd, e.g. 7.2V, to be applied across its terminals during operation of the main charge pump 212, without incurring damage to any of the internal devices composing the switch which individually can tolerate voltages only as high as Vdd (their maximum rated gate oxide stress voltage is Vdd), e.g. 3.6 V. The 7 V switch 232 connects with node 208 in FIG. 2 at an OUT pin 302. The connection to the main charge pump circuit at node 234 in FIG. 2 is provided from the IN pin 304. The 7 V switch includes a P-channel transistor 306 having its source/drain path connected between the IN pin 304 and node 308. The gate of transistor 306 is connected to the supply voltage $V_{DD}$, and the bulk is connected to the drain. Another P-channel transistor 310 has its source/drain path connected between node 308 and the supply voltage $V_{DD}$. The gate of transistor 310 is connected to receive the signal CLOCK_SHIFT and the bulk is connected to the source. The CLOCK_SHIFT signal is generated by the first auxiliary charge pump circuit 312. The first auxiliary charge pump circuit 312 generates the CLOCK_SHIFT signal responsive to the CLOCK signal input at node 314 to the input of an inverter 316. The output of the inverter 316 is connected to the clock shift circuit 317 which may be enabled and disabled responsive to the ENABLE_CP signal controlled by the output of the Schmitt trigger 299 discussed previously with respect to FIG. 2. The circuitry forming the clock shift circuit 317 will be more fully discussed herein below with respect to a discussion of the second auxiliary charge pump circuit 318.

An N-channel transistor 320 has its drain/source path connected between the supply voltage $V_{DD}$ and node 308. The gate of transistor 320 is connected to its drain at the supply voltage $V_{DD}$, so that the transistor functions as a diode. The bulk of transistor 320 is connected to ground. It is superior to choose a native N-channel device for 320 with a threshold voltage close to zero, although a regular N-channel device may be substituted if native devices are not available in the fabrication process. A resistor 322 used for current limiting is connected between node 308 and node 324. A P-channel transistor 326 has its source/drain path connected between node 324 and node 328. The gate of transistor 326 is connected to the CLOCKB_SHIFT signal at node 330 and the bulk of transistor 326 is connected to receive the control signal NWELL. The CLOCKB_SHIFT signal is used to turn on and off the 7 V switch 232 by pulling the gate of transistor 326 either to the voltage at OUT pin 302 (the "off state") or to Vdd, e.g. 3.6 volts (the "on state"). Transistors 306 and 310 are used to protect the gate oxide of transistor 326 from the OUT voltage at pin 302 which can go as high as 2Vdd, e.g. 7.2 V, when the voltage on the IN pin 304 concurrently goes to ground (due to the pumping mode operation of the main charge pump 212) and when the gate of transistor 326 is concurrently turned off using the same voltage as appears at pin OUT. A P-channel transistor 332 has its source/drain path connected between node 328 and the OUT pin 302 of the 7 V switch 232. The bulk of transistor 332 is connected to receive the control signal NWELL2 and the gate of transistor 332 is connected to the supply voltage $V_{DD}$. The NWELL signal applied to transistor 326 and the NWELL2 signal applied to transistor 332 are generated by the nwell bias generator circuitry 334. The transistors 306, 326 and 332 are the switch devices which pass the current from node 234 in the main charge pump 212 to node 208 when the switch is turned on.

The nwell bias generators 334 are connected at node 328. The n-well bias generators set the value of NWELL and NWELL2 to the supply voltage $V_{DD}$ when the voltage at pin 302 is less than the supply voltage $V_{DD}$ and set the value of NWELL and NWELL2 to the voltage at pin 302 when the voltage at pin 302 is greater than $V_{DD}$. The nwell bias generators 334 serve the function of preventing the parasitic p+/nwell junction diodes associated with the P-channel transistors 326, 332, 348, 350 from forward biasing when the voltage at pin 302 rises above the supply Vdd. The NWELL control signal is provided at the source of P-channel transistor 336. P-channel transistor 336 has its drain/source path connected between node 328 and node 338, with bulk connected to source. An N-channel transistor 340 also associated with the NWELL control signal has its drain/source path connected between the supply voltage $V_{DD}$ and node 338. The gate of transistor 340 is connected to the supply voltage $V_{DD}$ and the drain of transistor 340, so that the transistor functions as a diode. The bulk of transistor 340 is connected to ground. It is superior to choose a low or medium threshold N-channel device for transistor 340, although a regular N-channel device may be substituted if low or medium threshold devices are not available in the fabrication process. The NWELL2 control signal is provided at the source of P-channel transistor 342. P-channel transistor 342 has its drain/source path connected between node 328 and node 344, with bulk connected to source. An N-channel transistor 346 also associated with the NWELL2 control signal has its drain/source path connected between the supply voltage $V_{DD}$ and node 344. The gate of transistor 346 is connected to its drain at the supply voltage node, so that the transistor functions as a diode. The bulk of transistor 346 is connected to ground. It is superior to choose a low or medium threshold N-channel device for 346, although a regular N-channel device may be substituted if low or medium threshold devices are not available in the fabrication process.

The NWELL2 control signal from node 344 is also provided to the bulk of transistors 348 and 350. Transistors 348 and 350 prevent the overall charge pump 202 from drawing an input current at its Vpp pin 204 when the charge pump is in disable mode and the voltage at the Vpp pin 204 (connected to node 302 through an ESD protection resistor 206) is pulled above the supply voltage $V_{DD}$. Transistors 348 and 350 also limit the maximum clock amplitude of the CLOCKB_SHIFT signal to the voltage at pin 302, rather than allowing it to rise to a full 2Vdd, e.g. 7.2 volts. Transistor 350 has its drain/source path connected between node 328 and node 354. The gate of transistor 350 is connected to receive the CLOCK_SHIFT signal and the bulk is connected to receive the NWELL2 control signal. Transistor 348 is a P-channel transistor having its drain/source path connected between node 354 and node 330. The gate of transistor 348 is connected to the supply voltage $V_{DD}$ and the bulk is connected to the NWELL2 control signal. An N-channel transistor 356 has its drain/source path connected between the supply voltage $V_{DD}$ and node 330, with bulk connected to ground. The gate of transistor 356 is also connected to its drain at the supply voltage, so that the transistor functions as a diode. It is superior to choose a low or medium threshold N-channel device for 356, although a regular N-channel device may be substituted if low or medium threshold devices are not available in the fabrication process.

The second auxiliary charge pump circuit 318 is connected at node 330. The second auxiliary charge pump circuit 318 has the same configuration as the first auxiliary charge pump circuit 312 described herein above. The first auxiliary charge pump 312 and second auxiliary charge pump 318 shift the clock signal from a range of zero volts to Vdd up to a new range of Vdd to 2Vdd in the case of the first auxiliary charge pump 312 and up to a new a range of Vdd to the voltage at pin 302 in the case of the second auxiliary charge pump 318. The second auxiliary charge pump 318 produces an output signal CLOCKB_SHIFT that is 180 degrees out of phase with the output of the first auxiliary charge pump 312 CLOCK_SHIFT (these outputs can be thought of as logical inverses of one another); this is analogous to the manner in which CLOCKB is 180 degrees out of phase with CLOCK (and are logical inverses of one another). The auxiliary charge pump circuits 312 and 318 include an N-channel transistor 358 having its drain/source path connected between the supply voltage $V_{DD}$ and node 330. The gate of transistor 358 is connected to receive the WEAKBIAS control signal from node 227 in the weak bias generator circuit shown in FIG. 2b, and the bulk of transistor 358 is connected to ground. It is superior to choose a native N-channel device for 358 with a threshold voltage close to zero, although a regular N-channel device may be substituted if native devices are not available in the fabrication process. A P-channel transistor 360 is configured as a capacitor between node 362 and node 330. The gate of transistor 360 comprises the top plate of the capacitor and is connected to node 330. The source and drain of the transistor 360 are connected to node 362 as is the bulk of transistor 360. A P-channel transistor 364 has its source/drain path connected between the supply voltage $V_{DD}$ and node 362. The gate of the P-channel transistor 364 is connected to receive the ENABLE_CP signal that enables and disables the main charge pump 212 which contains the 7 V switch. A P-channel transistor 366 has its source/drain path connected between the supply voltage $V_{DD}$ and node 362, with bulk connected to Vdd. The gate of transistor 366 is connected to receive the CLOCK signal. An N-channel transistor 368 has its drain/source path connected between node 362 and node 370. The gate of transistor 368 is connected to receive the ENABLE_CP signal for enabling and disabling the main charge pump 212. The bulk of transistor 368 is connected to ground. An N-channel transistor 372 is connected between node 370 and ground, with bulk connected to ground. The gate of transistor 372 is connected to receive the CLOCK signal.

The 7 V switch 232 includes several states of operation, controlled by the overall charge pump 202. The choice of switch state depends upon the mode in which the overall charge pump 202 is operating and the voltage appearing at the Vpp pin 204. Each of these switch states of operation are described more fully with respect to FIG. 3 herein below.

7V Switch—On State

When the charge pump 202 is in pumping mode and the CLOCK signal is high, the 7 V switch 232 is in its "on state" of operation, as previously described with respect to FIG. 2. In its on state, the 7 V switch 232 is turned on and enables current to pass from its IN pin 304 to its OUT pin 302. When the CLOCK signal applied at the input of the second auxiliary charge pump circuit 318 goes to a high level of Vdd, this causes the bottom plate of the capacitor consisting of transistor 360 to be pulled to ground. This occurs because the Vdd level at their gates turns on transistor 372 and turns off transistor 366, and because the ENABLE_CP input at the gate of transistor 368 is at Vdd when the charge pump 202 is in pumping mode. This situation turns on transistors 368 and 372 and enables the connection of the bottom plate of capacitor 360 to ground. The native transistor 358, functioning as a diode with WEAKBIAS=Vdd (note that WEAKBIAS is equal to Vdd in pumping mode), automatically turns on as its source falls below Vdd, and thus enables the supply voltage $V_{DD}$ to charge the top plate of capacitor 360 up to Vdd. The use of a native N-channel device for transistor 358 instead a regular N-channel device allows the turn on voltage of the diode to be near zero, and thus allows the capacitor to charge almost fully to the supply voltage, e.g. 3.6 V, before the diode 358 turns off. The low or medium threshold transistor 356, also functioning as a diode, is placed in parallel with the native transistor 358 and sized to a large W/L value as a protection mechanism to prevent the CLOCKB_SHIFT signal at node 330 from ever dropping very far below the level of Vdd during switching transients (which could cause damage to transistor oxides connected to node 330 during the transient). Since transistor 358 is a native device with near zero threshold, its size cannot be made very large without contributing undesired Vpp pin leakage when the overall charge pump 202 is in disable mode; hence the necessity of adding the large medium threshold diode 356, which contributes much less leakage than making transistor 358 very large. Thus, the CLOCKB_SHIFT signal at node 330 settles to approximately Vdd, e.g. 3.6 volts, during the on state of the 7 V switch.

The first auxiliary charge pump circuit 312 operates according to the same internal mechanisms as the secondary auxiliary charge pump 318 just described, except that the inverse clock signal CLOCKB controls the inputs to the equivalents of transistors 366 and 372 instead of the CLOCK signal, thus resulting in an output CLOCK_SHIFT that is 180 degrees out of phase with the output of the second auxiliary charge pump CLOCKB_SHIFT. The first auxiliary charge pump 312 charges the CLOCK_SHIFT signal applied to the gate of transistor 310 up to 2Vdd, e.g. 7.2 volts, during the on state. In the on state, the main charge pump 212 is configured to place 2Vdd, e.g. 7.2 volts, at the IN pin 304, as previously described with respect to FIG. 2. This will cause the transistor 306 to turn on which attempts to charge node 308 (PROT 1) and node 324 (PROT 2) up towards 2Vdd, e.g. 7.2 volts. This in turn causes the diode represented by transistor 320 to turn off, and causes transistor 310 to turn off since its gate CLOCK_SHIFT is pulled to 2Vdd, e.g. 7.2 volts, by the first auxiliary charge pump 312. Note that when transistor 306 first turns on, its bulk is at a lower potential than its source. Thus, its junction diode forward biases. The resistor 322 is used to limit the initial in-rush current from the IN pin 304 to the OUT pin 302 so that the maximum current of the forward biased junction diode in 306 is not exceeded (which could damage the junction).

Transistor 326 will turn on since its gate is at Vdd, e.g. 3.6 volts, responsive to the output of the second auxiliary charge pump 318 and its source is charged up toward 2Vdd, e.g. 7.2 volts, responsive to the 2Vdd voltage applied at the IN pin 304 by the main charge pump 212. This causes the source of transistor 332 to charge toward 2Vdd, e.g. 7.2 volts, which finally causes the transistor 332 to turn on. Once the transistor 332 turns on, it will charge up the OUT pin 302 until all of the charge provided at the IN pin 304 is gone. As the charge at the IN pin 304 drains away, the IN pin 304 falls to Vdd, e.g. 3.6 volts, and transistors 306, 326 and 332 all subsequently turn off as a result.

Transistor 350 is turned off the entire time during the on state since its gate is pulled to 2Vdd, e.g. 7.2 volts, responsive to the CLOCK_SHIFT signal provided from the first auxiliary charge pump 312. This allows no current to flow through transistor 348 during the on state.

Transistors 336 and 342 within the n-well bias generators 334 both turn on, and the diodes represented by transistors 340 and 346 both turn off, responsive to the OUT voltage at pin 302 exceeding the supply voltage $V_{DD}$. This causes the voltages at the NWELL node 338 and the NWELL2 node 344 to charge up to the OUT voltage at pin 302, and thus prevents the parasitic p+/nwell junction diodes of P-channel devices 326, 332, 348, and 350 from becoming forward biased. If the OUT voltage at pin 302 is instead less than $V_{DD}$, then node 328 would be pulled down toward Vdd by P-channel transistor 332. This would then have the effect of turning off transistors 336 and 342 and causing diodes 340 and 346 to limit the voltage at NWELL node 358 and NWELL2 node 344 from falling much below Vdd, e.g. 3.6 volts.

During the on state, all of the transistors in the 7 V switch 232 remain protected against voltages as high as 2Vdd, e.g. 3.6 V+3.6 V=7.2 V, appearing at IN pin 304, appearing at OUT pin 302, and appearing at various internal nodes inside the 7 V switch as just described, assuming the supply voltage does not exceed the maximum rated gate oxide stress voltage, e.g. 3.6 V.

7 V Switch—Off State

When the charge pump 202 is in pumping mode and the CLOCK signal is low, the 7 V switch 232 is in its "off state" of operation, as previously described with respect to FIG. 2. Within the off state, the 7 volt switch 232 is turned off and current is not allowed to pass from its IN pin 304 to its OUT pin 302. When in the off state, the transistor 368 is turned on since the main charge pump 212 with which the 7 volt switch 232 is associated is in pumping mode, as previously described with respect to FIG. 2. When the CLOCK signal goes low to 0 volts, this turns on transistor 366 and turns off transistor 372. This configuration connects the bottom plate of the capacitor 360 to the supply rail, e.g. 3.6 V, through transistor 366, so that the previously stored supply voltage on the capacitor from the on state of the switch, e.g. 3.6 V, now appears in series with the supply rail. In this series configuration, the total voltage appearing at the top plate of capacitor 360 with reference to ground now becomes equal to twice the supply voltage, e.g. 3.6 V+3.6 V=7.2 V. As the voltage at node 330 goes to 2Vdd, e.g. 7.2 volts, this causes the diodes represented by transistors 358 and 356 to be turned off. The voltage at node 330 going to 2Vdd, e.g. 7.2 volts, also causes transistors 348 and 350 to be turned on since the CLOCK_SHIFT signal applied to the gate of transistor 350 is now at Vdd, e.g. 3.6 volts, in the off state. When transistors 348 and 350 are turned on, the voltage at node 330 (i.e., the CLOCKB_SHIFT signal) is quickly pulled down to the voltage at node 328 that is presently on the OUT pin 302, being limited by transistor 332 to no lower than Vdd. Note that the transition from 2Vdd on node 330 to the voltage on OUT pin 302 happens almost instantaneously, so that for all intents and purposes it appears as if node 330 simply transitions smoothly from Vdd to the voltage at OUT pin 302 as the switch goes from the on state to the off state. The voltage at the OUT pin 302 is now firmly applied to the gate of transistor 326 (being limited to no lower than Vdd).

During pumping mode of the overall charge pump 202 when CLOCK initially goes low and the 7 V switch initially transitions to the off state, the main charge pump circuit 212 places a voltage as low as 0 volts on the IN pin 304 of the 7 V switch. A value as low as 0 volts initially appears at pin 304 because the discharged capacitor 242 in the main charge pump (discharged when CLOCK was high), with as low as zero volts stored between its top and bottom plates, has its bottom plate connected to ground and its top plate connected to node 234 and hence node 304, as was previously described with respect to FIG. 2. In the off state, the gate of transistor 310 drops to Vdd, e.g. 3.6 volts, responsive to the CLOCK- _SHIFT signal. Thus, any residual voltage at the PROT1 node 308 and the PROT2 node 324 are discharged down to Vdd, e.g. 3.6 volts. The purpose of diode 320 is to prevent node 308 and node 324 from falling below Vdd during switching transients, which could cause damage to the oxides of transistors connected to nodes 308 and 324 during the transient. With 0 volts at node 306 and Vdd, e.g. 3.6 volts, at node 308 and node 324, the P-channel transistors 306 and 326 are turned off. Thus, since transistor 306 and transistor 326 are each turned off, the 7 volt switch 232 is now turned off and cannot pass a current from IN pin 304 to OUT pin 302.

Transistors 336 and 342 within the n-well bias generator circuit 334 are both still turned on if the voltage at OUT pin 302 is greater than the supply voltage $V_{DD}$, with diodes 340 and 346 turned off. During the off state, this maintains the NWELL signal at node 338 and the NWELL2 signal at node 344 at the voltage on the OUT pin 302 in the case where OUT>Vdd. Otherwise, if the voltage at OUT pin 302 is less than Vdd, transistors 336 and 342 are off and diodes 340 and 346 limit the voltage on NWELL and NWELL2 from falling much below Vdd.

During the off state, all of the transistors in the 7 V switch 232 remain protected against voltages as high as 2Vdd, e.g. 3.6 V+3.6 V=7.2 V appearing at OUT pin 302, and appearing at various internal nodes inside the 7 V switch as just described, assuming the supply voltage does not exceed the maximum rated gate oxide stress voltage, e.g. 3.6 V.

7V Switch—Disable State

The 7 V switch is placed in its "disable state" whenever the overall charge pump 202 is in disable mode, pre-charge mode, discharge mode, or test mode. When the 7 volt switch 232 is in its disable state, the 7 volt switch 232 operates in the following fashion. The ENABLE_CP signal goes low to 0 volts in the disable state and transistor 368 is turned off. This effectively disconnects the CLOCK signal from controlling the second auxiliary charge pump 318. With the ENABLE_CP signal at 0 volts, transistor 364 within the second auxiliary charge pump circuit 318 is turned on which pulls the bottom plate of the capacitor-configured transistor 360 up to the supply voltage $V_{DD}$. Transistor 358 also connects the top plate of capacitor 360 to the supply voltage $V_{DD}$. With both the top and bottom plates of capacitor 360 at Vdd, e.g. 3.6 volts, the CLOCKB_SHIFT signal at node 330 and thus the gate of transistor 326, are set to 3.6 volts. This causes transistor 356 to remain off. Using the same internal mechanism, the first auxiliary charge pump 312 will also have its output CLOCK_SHIFT signal at Vdd, e.g. 3.6 volts, for reasons the same as those discussed with respect to the second auxiliary charge pump 318. This sets the voltage at the gate of transistor 350 at Vdd, e.g. 3.6 volts. The gate of transistor 310 will also be set at Vdd, e.g. 3.6 volts, responsive to the output of the first auxiliary charge pump 312. This causes the voltage at the PROT1 node 308 and the PROT2 node 324 to be held at Vdd, e.g. 3.6 volts, by transistors 310 and 320. The main charge pump 212 will also set the IN pin voltage 304 at Vdd, e.g. 3.6 volts, when ENABLE_CP is low as previously described with respect to FIG. 2.

The 7 volt switch 232 is now tolerant of any external voltage from 0 volts to 2Vdd, e.g. 7.2 V, applied at the OUT pin 302 in its disable state, in the sense that no internal devices will incur damage as a result of exceeding their maximum rated gate oxide stress voltage, e.g. 3.6 V, assuming the supply voltage itself does not exceed the maximum rated gate oxide stress voltage. Additionally, as a consequence of the unique design described herein, the leakage current into the 7 V switch is kept very small in its disable state, e.g. <200 pA at 26 C, for any voltage from 0 volts to 2Vdd, e.g. 7.2 volts, applied at the OUT pin 302.

7V Switch—Disable State (Vpp>Vdd)

When a voltage greater than Vdd is applied to the OUT pin 302 in the disable state, say 2Vdd, this causes transistor 332, transistor 350 and transistor 348 to be turned on, enabling current to flow in the reverse direction from the OUT pin 302 to node 330. This charges the voltage at node 330 (CLOCKB-_SHIFT signal) up to 2Vdd, e.g. 7.2 volts, which turns off transistor 326. Shutting off transistor 326 when OUT>Vdd during the disable state is the main purpose of transistors 348 and 350. Otherwise, the circuitry on the IN pin side of transistor 326 would draw a very large input leakage current whenever OUT>Vdd, a situation which is very undesirable.

Since transistor 358 is a native, it would leak considerably during the disable state when OUT>Vdd if its gate were left tied to the supply voltage $V_{DD}$ so that its Vgs=0 V. This would provide a large leakage path through transistors 332, 350, 348, 358 to Vdd. To lower the leakage current of the native 358 and thus lower the leakage current flowing through the aforementioned leakage path, the gate of 358 is intentionally biased by the WEAKBIAS signal below Vdd by a few hundred millivolts, e.g. 3.6 V–0.4 V=3.2 V, using the weak bias generator circuit in FIG. 2b. Thus the Vgs of the native 358 becomes negative, e.g. Vgs=–0.4V, and hence the value of the leakage current through the aforementioned path drops exponentially as a result, e.g. by about four orders of magnitude in the case of Vgs=–0.4 V. Limiting the current through this leakage path during the disable state is one of the main purposes of the WEAKBIAS signal.

7V Switch—Disable State (Vpp<Vdd)

When a voltage less than Vdd is applied to the OUT pin 302, say 0 volts, this causes transistor 332 to turn off. As a result, the charge pump does not source any current out of the OUT pin 302, which would be very undesirable. With transistor 332 turned off, all relevant transistors to the IN pin side of transistor 332 are also turned off.

SUMMARY WAVEFORMS

Figure 4:
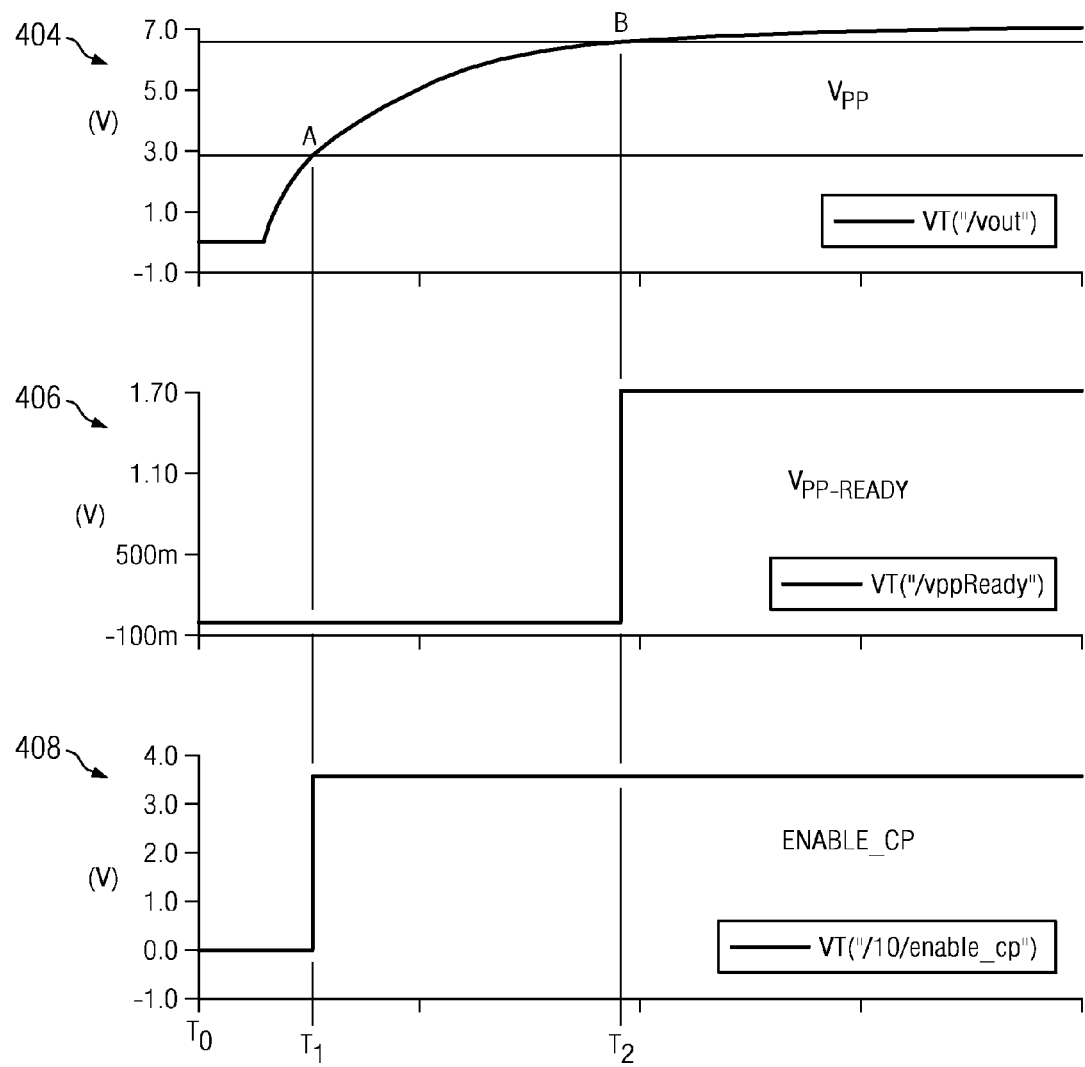
FIG. 4 illustrates various voltages associated with the charge pump of FIG. 2.

Referring now to FIG. 4, there are illustrated various voltage waveforms associated with various modes of operation of the charge pump 202. Waveform 404 represents the programming voltage VPP at pin 204. Waveform 406 represents the VPP_READY control signal provided from the output of the comparator at pin 253. Waveform 408 represents the ENABLE_CP control signal provided from the output of NOR gate 285 associated with the Schmitt trigger 299 that enables and disables the main charge pump 212. Times $T_0$ to $T_1$ represents the pre-charge mode described herein above. The programming voltage VPP is pre-charging from the 0 volt level up to the level at which the main charge pump 212 becomes enabled and begins pumping the programming voltage VPP. At time $T_1$, the ENABLE_CP control signal goes from a logical "low" level to a logical "high" level. This enables the main charge pump circuit 212, and the main charge pump circuit begins pumping the Vpp voltage from approximately 3 volts up to approximately 7 volts. The pre-charge circuit 210 is disabled at time $T_1$ and no longer provides the charging voltage as it did from time $T_0$ to time $T_1$. The main charge pump 212 provides the programming voltage VPP from time $T_1$ to time $T_2$. At time $T_2$, the comparator 275 generates the logical "high" value of the VPP_READY signal, indicating that the programming voltage Vpp is now at a sufficient level to program the associated OTP memory. At some point after time $T_2$, the voltage at the VPP pin 204 would be discharged by the discharge circuit (not shown) and the charge pump circuit would become disabled (not shown).

Figure 5:
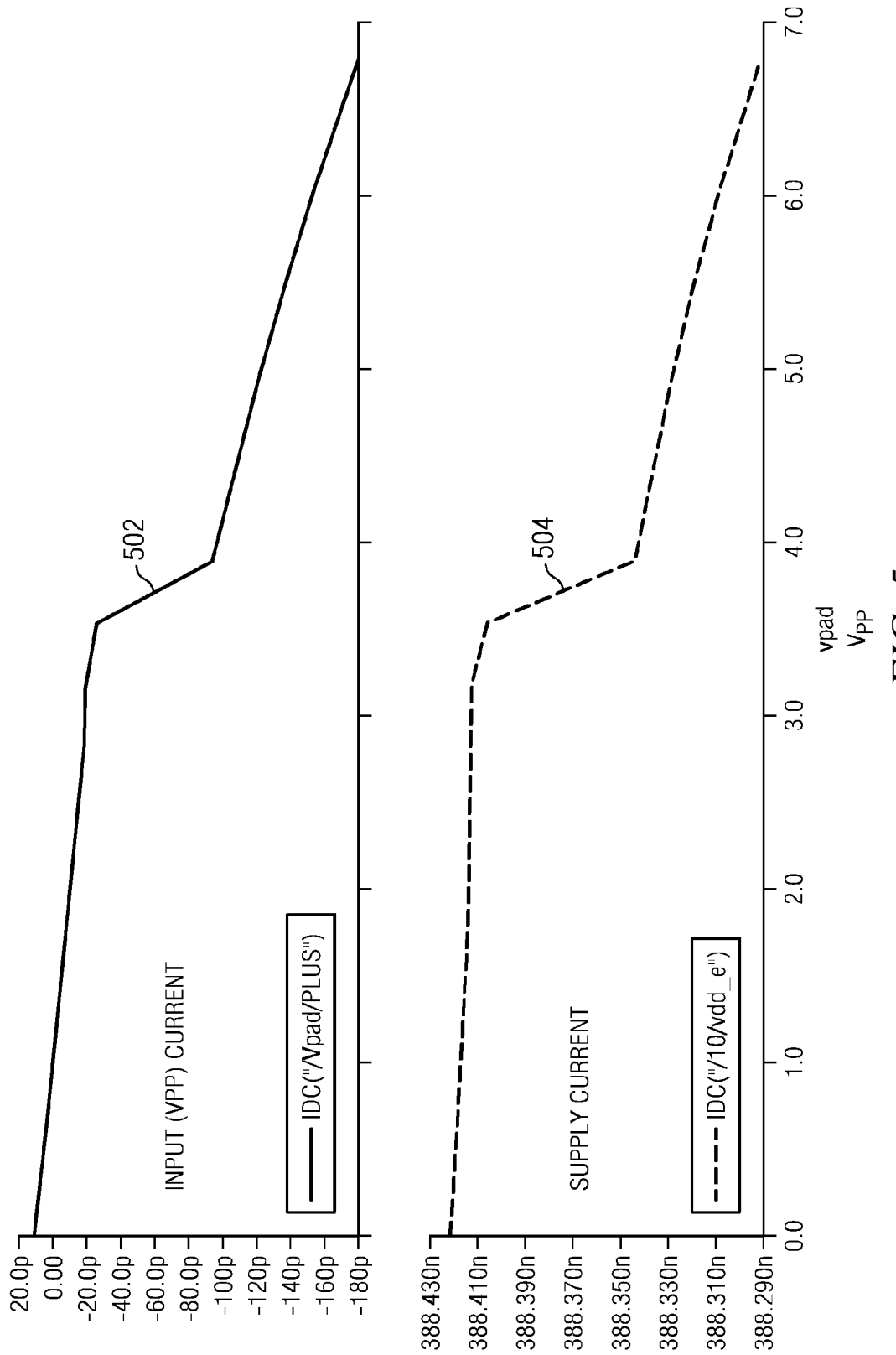
FIG. 5 illustrates currents of the charge pump when in a disabled mode.

Referring now to FIG. 5, there is illustrated the VPP and supply currents for the charge pump circuit of FIG. 2. Waveform 502 represents the leakage current (y-axis) of the VPP pin 204 when the charge pump 202 is in the disabled mode and various voltages (x-axis) are applied to the Vpp pin 204. Positive values represent leakage out of the Vpp pin, and negative values represent leakage into the Vpp pin. Waveform 502 shows a maximum leakage of 180 pA into the Vpp pin of the charge pump when 6.75V is applied to Vpp under typical conditions. Waveform 504 represents the current drawn from the supply Vdd (y-axis) for different voltages applied at the Vpp pin (x-axis) when the charge pump 202 is in the disabled mode. Waveform 504 shows a supply current of 388 nA for all values of Vpp under typical conditions.

Using the above described system and circuitry, a one time programmable memory may have associated with it an integrated charge pump circuit that enables generation of programming voltages on chip necessary to program the OTP memory within the chip. The programming voltages will not damage the other circuitries of the charge pump during the programming process, enabling real time programming of the device during operation of the apparatus associated with the OTP memories.

It will be appreciated by those skilled in the art having the benefit of this disclosure that this charge pump with low power, high voltage protection circuitry provides a charge pump with high voltage protection circuitry. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A charge pump circuitry for generating a charging voltage for programming a one time programmable (OTP) memory, comprising:
   a charge pump sub-circuit for generating the charging voltage in a second voltage range when the charging voltage exceeds a threshold level;
   a precharge circuit for generating the charging voltage in a first voltage range when the charging voltage is below the threshold level;
   a voltage measurement circuit for determining the charging voltage, the voltage measurement circuit including a transistor having a source coupled to ground and configured to operate in a weak inversion region to provide a leakage current to ground to protect the voltage measurement circuit from a voltage at an output of the charge pump sub-circuit;
   a first control circuit for enabling the precharge circuit and disabling the charge pump sub-circuit in a first mode of operation responsive to the charging voltage being determined to be below the threshold level and for disabling the precharge circuit and enabling the charge pump sub-circuit in a second mode of operation responsive to the charging voltage being determined to exceed the threshold level; and
   a second control circuit for providing an indication that the charging voltage has reached a charging level for programming the OTP memory responsive to the determined charging voltage.

2. The charge pump circuitry of claim 1, further including a discharge circuit for discharging the charging voltage below a supply voltage responsive to a discharge control signal.

3. The charge pump circuitry of claim 1, wherein the charge pump sub-circuit further comprises:
   charging circuitry for generating the charging voltage; and
   a switching circuit for connecting and disconnecting the charging voltage of the charging circuitry to and from an output of the charge pump circuitry.

4. The charge pump circuitry of claim 3, wherein the switching circuit further protects the charge pump sub-circuit from voltages at an output of the charge pump circuitry, and prevents leakage current through an output of the charge pump circuitry when the charge pump is disabled.

5. The charge pump circuitry of claim 1, wherein the voltage measurement circuit further comprises a voltage divider.

6. The charge pump circuitry of claim 5, wherein the voltage measurement circuit includes a Schmitt trigger for generating a mode control signal to enable the first control circuit to place the charge pump circuitry in the first mode of operation and the second mode of operation responsive to an output from a first node of the voltage divider and the threshold level.

7. The charge pump circuitry of claim 5, wherein the voltage measurement circuit comprises a comparator for comparing an output of a node of the voltage divider and a reference threshold.

8. A charge pump circuitry for generating a charging voltage for programming a one time programmable (OTP) memory, comprising:
   a charge pump sub-circuit for generating the charging voltage in a second voltage range when the charging voltage exceeds a threshold level, wherein the charge pump further comprises:
      charging circuitry for generating the charging voltage, wherein the charging circuitry generates and tolerates voltages at an output of the charging circuitry of up to twice a maximum gate oxide stress voltage without damaging the charging circuitry; and
      a switching circuit for connecting and disconnecting the charging voltage of the charging circuitry to and from an output of the charge pump circuitry, wherein the switching circuitry tolerates voltages at an input and output of the switching circuitry of up to twice the maximum gate oxide stress voltage without damaging the switching circuitry;
   a precharge circuit for generating the charging voltage in a first voltage range when the charging voltage is below the threshold level, wherein the precharge circuit tolerates voltages at an output of the pre charge circuit of up to twice the maximum gate oxide stress voltage without damaging the precharge circuit;
   a discharge circuit for discharging the charging voltage below the supply voltage responsive to a discharge control signal, wherein the discharge circuit tolerates voltages at an output of the discharge circuit of up to twice the maximum gate oxide stress voltage without damaging the discharge circuit;
   a voltage divider circuit, wherein the voltage divider circuit tolerates voltages at an output of the voltage divider circuit of up to twice the maximum gate oxide stress voltage without damaging the voltage divider circuit;

a first control circuit for enabling the precharge circuit and disabling the charge pump sub-circuit in a first mode of operation responsive to the charging voltage being determined to be below the threshold level and for disabling the precharge circuit and enabling the charge pump sub-circuit in a second mode of operation responsive to the charging voltage being determined to exceed the threshold level; and a second control circuit for providing an indication that the charging voltage has reached a charging level for programming the OTP memory responsive to the determined charging voltage.

9. The charge pump circuitry of claim 8, wherein the switching circuit further protects the charge pump sub-circuit from voltages at an output of the charge pump circuitry of up to twice the maximum gate oxide stress voltage without damaging the charge pump sub-circuit, and prevents leakage current through an output of the charge pump circuitry when the charge pump is disabled.

10. The charge pump circuitry of claim 8, further comprising a voltage measurement circuit including the voltage divider circuit and a Schmitt trigger for generating a mode control signal to enable the first control circuit to place the charge pump circuitry in the first mode of operation and the second mode of operation responsive an output from a first node of the voltage divider circuit and the threshold level, and the voltage measurement circuit further includes circuitry to protect the input of the Schmitt trigger from voltages at an output of the charge pump circuitry of up to twice the maximum gate oxide stress voltage.

11. The charge pump circuit of claim 8, further comprising a voltage measurement circuit including the voltage divider circuit and a comparator for comparing an output of a node of the voltage divider circuit and a reference threshold level, and the voltage measurement circuit further includes circuitry to protect the input of the comparator from voltages at an output of the charge pump circuitry of up to twice the maximum gate oxide stress voltage.

12. A method for generating a charging voltage for programming a one time programmable (OTP) memory, comprising:

determining the charging voltage at an output of a charge pump circuitry;

enabling a precharge circuit and disabling a charge pump sub-circuit in a first mode of operation responsive to the charging voltage being determined to be below a threshold level;

generating the charging voltage in a first voltage range when the charging voltage is below the threshold level in the first mode of operation;

disabling the pre charge circuit and enabling the charge pump sub-circuit in a second mode of operation responsive to the charging voltage being determined to exceed the threshold level;

generating the charging voltage in a second voltage range when the charging voltage exceeds the threshold level in the second mode of operation;

generating an indication that the charging voltage has reached a charging level for programming the OTP memory responsive Jo the determined charging voltage; and protecting internal circuitry of the charge pump circuitry from voltages at an output of the charge pump circuitry of up to twice the maximum gate oxide stress voltage without damaging the internal circuitry of the charge pump circuitry.

13. The method of claim 12 further including the step of protecting internal circuitry of the charge pump circuitry from voltages generated at internal nodes of the charge pump circuitry of up to twice the maximum gate oxide stress voltage, which are generated internally for the purpose of generating the charging voltage at the output of the charge pump circuitry of up to twice the maximum gate oxide stress voltage for programming the OTP memory, without damaging the internal circuitry of the charge pump circuitry.

14. The method of claim 12 further including the step preventing leakage current through the output of the charge pump circuitry when the charge pump circuitry is disabled.

15. The method of claim 12 further including the step of trimming the charge pump circuitry in a test mode in order to set the charging level where the charging level is generated for programming an associated OTP memory.

16. The method of claim 12 further including the step of discharging the charging voltage below the supply voltage responsive to a discharge control signal.

17. The method of claim 12 wherein the step of generating the charging voltage in the first voltage range further comprises the steps of:

disconnecting the charge pump sub-circuit from the output of the charge pump circuitry; and generating the charging voltage in the first voltage range from the precharge circuit.

18. The method of claim 12, wherein the step of determining the charging voltage further comprises measuring an output voltage using a voltage divider.

19. The method of claim 12, wherein the step of generating the charging voltage in the first mode of operation and the second mode of operation further includes the steps of:

generating a mode control signal at a first logical level to place the charge pump circuitry in the first mode of operation when the charging voltage is below the threshold level; and generating the mode control signal at a second logical level to place the charge pump circuitry in the second mode of operation when the charging voltage exceeds the threshold level.

20. The method of claim 12, wherein the step of generating the indication further includes the step of comparing the charging voltage at the output of the charge pump circuitry with a reference threshold.

* * * * *